United States Patent [19]

Reichmuth

[11] Patent Number: 4,860,839

[45] Date of Patent: Aug. 29, 1989

[54] WEIGHING APPARATUS INCLUDING ACTIVE LOW-PASS FILTER MEANS

[75] Inventor: Arthur Reichmuth, Wetzikon, Switzerland

[73] Assignee: Mettler Instruments AG, Greifensee, Switzerland

[21] Appl. No.: 298,056

[22] Filed: Jan. 18, 1989

[30] Foreign Application Priority Data

Feb. 5, 1988 [CH] Switzerland ............ 413/88

[51] Int. Cl.$^4$ .................. G01G 23/10; H03K 5/00
[52] U.S. Cl. ................... 177/185; 328/165
[58] Field of Search .............. 177/185; 328/165

[56] References Cited

U.S. PATENT DOCUMENTS

| 3,670,833 | 6/1972 | Tomohiko et al. | 177/185 X |
| 4,316,517 | 2/1982 | Jonath . | |
| 4,591,011 | 5/1986 | Baumann . | |
| 4,628,470 | 12/1986 | Baumann . | |

FOREIGN PATENT DOCUMENTS 3311831 10/1984 Fed. Rep. of Germany .
618792 8/1980 Switzerland .

Primary Examiner—George H. Miller, Jr.
Attorney, Agent, or Firm—Laubscher, Presta & Laubscher

[57] ABSTRACT

A weighing system including a weighing cell (1) which supplies a measurement signal (I) to an A/D converter (3) via a signal line (2). An interference signal (i), superposed on the measurement signal, is decoupled out of signal line (2) at the signal output of the weighing cell (1), rotated by means of an inverter (4) in terms of phase by 180°, and again coupled into the signal line (2) at the signal input of the A/D converter. An ohmic resistance (RO) is connected in series in the signal line (2) between the uncoupling node (AK) and the in-coupling node (EK). The interference signal (i) is decoupled preferably capacitively via a series circuit that forms the frequency-determining member of the active low-pass filter including a condenser (C) and an ohmic resistance (R1). On the other hand, a galvanic coupling (R3) is provided for the recoupling of the interference signal (−i). With this active low-pass filter, one can attain a substantially complete suppression of the interference signals without any subsequent adjustment of the filter.

7 Claims, 1 Drawing Sheet

WEIGHING APPARATUS INCLUDING ACTIVE LOW-PASS FILTER MEANS

STATEMENT OF THE INVENTION

This invention relates to an active low-pass filter for the suppression of interference signals which are superimposed, in the form of alternating current interference currents, upon the direct current weighing signal delivered by the weighing cell of an electro-mechanical scale and supplied, via a signal line, to an analog-to-digital (A/D) converter, particularly for high-resolution scales, whereby the interference signals are separated from the signal line at the signal output of the weighing cell, are shifted in phase by 180° by an inverter, and are reintroduced galvanically into the signal line at the signal input of the A/D converter, use being made of an ohmic resistance connected in the signal line between the separation and reintroduction junctions.

BRIEF DESCRIPTION OF THE PRIOR ART

As evidenced by the prior U.S. Pat. to Jonath Nos. 4,316,517 and 4,316,518, and Baumann Nos. 4,591,011 and 4,628,470, it is known in the weighing apparatus prior art to supply to an analog-to-digital converter a direct-current weighing signal the magnitude of which is a function of a load being measured. The analog-to-digital converter converts the d-c weighing signal to a digital signal that is processed to afford an indication of the load.

The suppression of the interference range alternating-current signals produced, for example, by vibration of the scale, is necessary to permit full utilization of the modulating range of the A/D converter by the weighing signal, so that errors in the analysis of the weighing signal caused by superposed interference signals over-riding the input range of the A/D converter, can be avoided. Expansion of the input range of the A/D converter implies relatively high cost in the case of high resolution, and does not come into consideration here.

As evidenced by the German Laid-Open Application No. 3,311,831, it is known in the art in active low-pass filters of this type to smooth out a DC measurement signal upon which an interference signal is superimposed by directly (i.e., galvanically) decoupling the interference signal, and by capacitatively recoupling the decoupled interference signal after phase-shifting by 180° via an RC circuit. The capacitive decoupling and recoupling of interference signals is likewise shown in the art, as evidenced by the Swiss Pat. No. 618,792.

The direct decoupling of the interference signals is not critical in case of a measurement signal defined by the voltage value; on the other hand, in case of a measurement signal defined by the current value, it would lead to a reduction of the measurement signal that would falsify the measurement result when DC current is removed. To prevent this, the capacitive decoupling of the interference signal has been proposed.

In the reintroduction of the interference signals, which are phase-shifted by 180°, use is made of capacitive coupling, for the purpose mentioned, in the previously indicated known active low-pass filters. By means of this measure one can, of course, make sure that drift properties of an operational amplifier forming the inverter will not have any influence on the measurement circuit; on the other hand, this is connected with problems whose solutions are less well optimized than measures for drift compensation.

Here, the desired resolution of the scale plays an essential role. The higher one sets the resolution of the scale, in general the lower the boundary frequency for the interference signal to be compensated will be selected, so that the processing of the measurement signal in the A/D converter will take place without any problem. But this calls for the use of a coupling capacitor with a high capacity and/or of an inverter having a great voltage swing at the signal output. Both of these measures entail considerable disadvantages. The reduced isolation resistance of a capacitor with very high capacity can lead to drift currents whose influence on the measurement signal can no longer be neglected (that is to say, the capacitive coupling, used to prevent such drift currents, will have no real or practical effect any longer). Besides, such a capacitor is so voluminous that there is no room for it any longer in miniaturized circuits. To keep the disadvantages of a big capacitor within limits, it would be necessary to provide an inverter with a great voltage swing. But such a measure can be implemented only by increasing the power supply voltage of the inverter and is also in contradiction to the effort to keep the power supply voltage for all parts of the electronics of a scale at the same level and to reduce it below the usual level in order to reduce power loss of the scale.

If both the decoupling and the recoupling of the interference signal take place via a capacitive path, then the active filter contains two capacitors whose capacities together will influence the degree of interference signal suppression. This circumstance is a disadvantage inasmuch as the comparatively great tolerances of the capacity values do not allow one to predetermine in advance precisely the degree of the interference signal suppression attained with the active filter. As a rule, in other words, the measurement signal will, after the active filter, contain a residual ripple which can be eliminated only through an adjustment of each active filter used. But such an adjustment is laborious and expensive.

SUMMARY OF THE INVENTION

Accordingly, a primary object of the present invention is to provide an improved weighing system in which the alternating-current interference signals are decoupled from the system, shifted in phase by 180°, and are reintroduced galvanically into the system. Thus, the invention goes a different route in order to avoid the abovementioned disadvantages of the known active low-pass filters in the envisaged area of application; specifically, the disadvantage of the direct coupling or reintroduction of the phase-shifted interference signal is accepted contrary to prevailing considerations in the realization that the drift properties of the active low-pass filter, and errors resulting therefrom in the measurement signal are more easily and with less effort controlled than the disadvantageous effects which are inherent in the known solutions for the attainment of a lower boundary frequency. In this sense, a main object of the invention resides in the fact that a galvanic coupling is provided for the reintroduction of the phase-shifted interference-signal.

For the decoupling of the interference signal, a galvanic coupling is likewise possible when, for example with the help of an impedance converter, one makes certain that the DC current tapping remains within the limits that are decisive for the accuracy of the measurement signal. Capacitive decoupling, however, as a rule is simpler in that the already present capacitor of the frequency-determining RC circuit at the same time can serve as coupling capacitor.

In both cases, the active low-pass filter according to the invention offers the advantage that the capacitor of the RC circuit, acting as high pass, can be dimensioned considerably smaller for the desired boundary frequency than in the case of capacitive interference-signal reintroduction, because one can work on a lower current level and that the voltage lift of a customary inverter here is sufficient also with reduced power supply voltage for the distortion-free processing of strong, lowfrequency interference signal currents. The degree of interference signal suppression moreover depends only on the resistance values of the ohmic resistances present in the active filter and these can be maintained with sufficient accuracy. Thus, with the help of the active low-pass filter according to the invention, there can—without any subsequent adjustment—be achieved a practically complete suppression of the interference signals superimposed on the measurement signal and thus also a measurement result that is virtually independent of the vibrations of the scale.

In accordance with another object of the invention, the influence of the drift properties of the active current filter upon the measurement signal can be reduced, for example, by virtue of the fact that a pair of operational amplifiers with parallel, mutually counteracting offset drift is provided for the inverter of the current filter and for the input stage of the A/D converter. Another solution consists in the fact that the inverter is formed by an operational amplifier whose non-inverting input is connected with the reintroduction junction. Thus, possible drift properties of the operational amplifier in the input stage of the A/D converter do not have an adverse effect on the re-coupled current. If widely differing requirements are established for the two operational amplifiers, then this solution is preferred in order to have a free hand in the choice of the operational amplifier which forms the inverter and which should have the smallest possible offset drift. By the way, the remaining drifts of these operational amplifiers can also be included in already existing electronic circuits for the temperature compensation of other elements.

BRIEF DESCRIPTION OF THE DRAWINGS

Other objects and advantages of the invention will become apparent from a study of the following specification, when viewed in the light of the accompanying drawings, in which.

DETAILED DESCRIPTION

Figure 1:
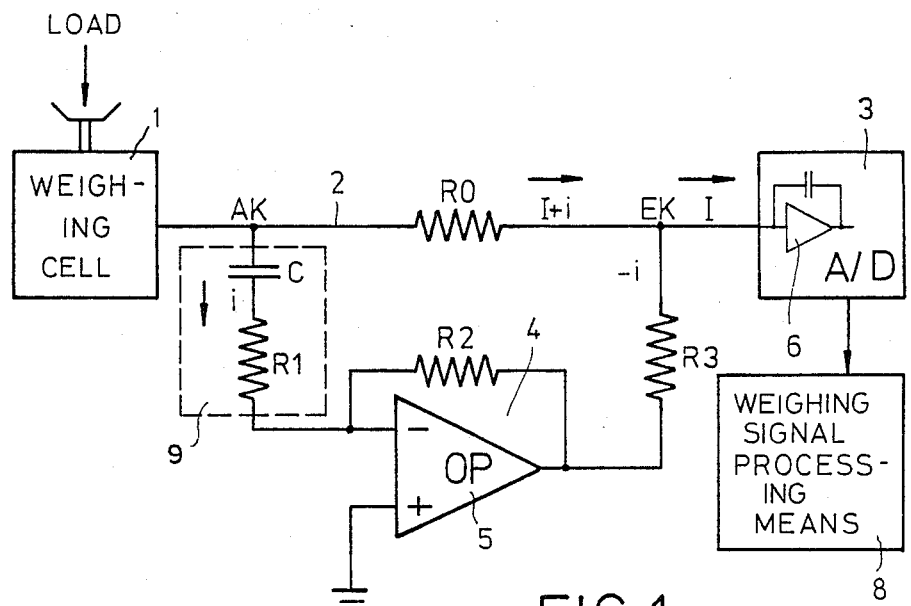
FIG. 1 illustrates the interference signal suppression system of the present invention.

Referring first more particularly to FIG. 1, the weighing cell 1 supplies a load-responsive DC current I for transmission to the signal processing means 8 of an electro-mechanical scale. Superposed on the measurement signal is an interference signal i in the form of an alternating current. Measurement signal I is supplied in known manner via a signal line 2 to an analog-to-digital (A/D) converter 3. Interference signal i is separated from signal line 2 at the signal output junction AK of weighing cell 1, and is shifted by an inverter 4 in terms of phase by 180° (−i), whereupon it is again coupled into the signal line 2 at the signal input junction EK of A/D converter 3. At the coupling junction EK, the interference signals i and −i compensate each other so that only the measurement signal I passes to the A/D converter 3.

Between the de-coupling junction AK and the coupling junction EK there is connected in series in signal line 2 an ohmic resistance RO from which a voltage, proportional to the interference signal, is tapped to control the inverter 4. This resistance RO does not have any influence on the magnitude of the measurement signal I. Inverter 4 is formed by an operational amplifier 5 which is provided with a feedback ohmic resistance R2. The non-inverting input of the operational amplifier is connected with ground in the embodiment of FIG. 1.

The decoupling of interference signal i is accomplished capacitively via a capacitor C connected in series with the ohmic resistor R1, which elements form the frequency-determining member 9 of the active low-pass filter. A galvanic coupling by means of ohmic resistance R3 is provided for the coupling or reintroduction of interference signal −i to signal line 2.

In the example according to FIG. 1, there can be used for inverter 4 of the active low-pass filter and input stage 6 of the A/D converter 3 a pair of operational amplifiers with parallel, mutually counteracting offset drift.

Figure 2:
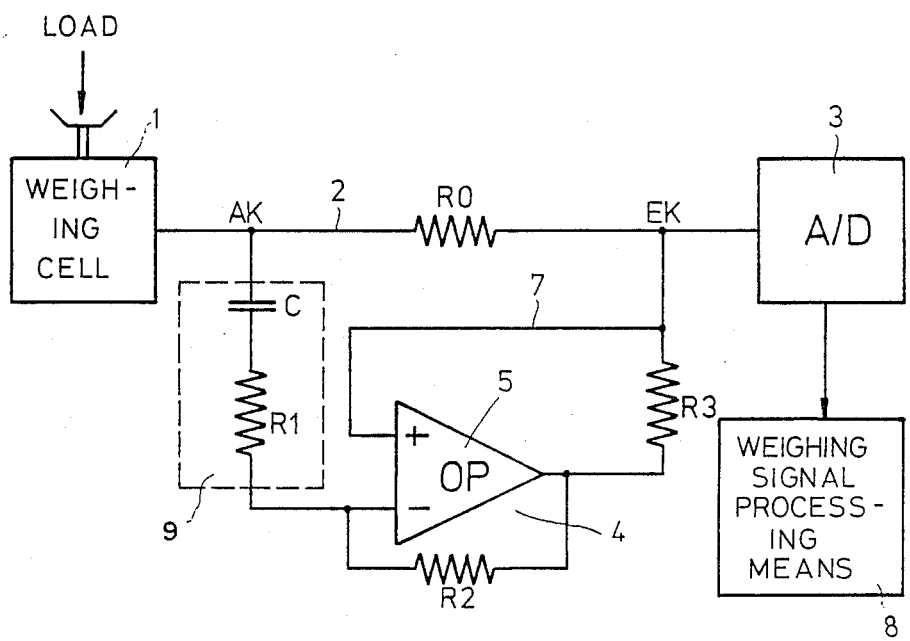
FIG. 2 illustrates a modification of the apparatus of FIG. 1.

The embodiment example according to FIG. 2 differs from the example according to FIG. 1 only in that the non-inverting input of the operational amplifier 5 is not connected with ground but, via a line 7, with the re-coupling junction EK. An offset drift, possibly appearing at the input of the A/D converter, in this case has an equal effect on the input potential and the output potential of inverter 4 so that there will be no additional voltage across resistance R3 which would lead to a current going to the in-coupling node EK which would falsify measurement signal I.

While in accordance with the provisions of the Patent Statutes the preferred forms and embodiments of the invention have been illustrated and described, it will be apparent that changes and variations may be made without deviating from the inventive concepts set forth above.

What is claimed is:

1. In a high-resolution weighing system including a weighing cell (1) having an output terminal for supplying a direct-current loadresponsive weighing signal (I) having an alternating-current interference signal (i) superimposed thereon, analog-to-digital converter means (3) having an output terminal adapted for connection with weighing signal processing means (8), said converter means also having an input terminal, a connecting resistor (RO) connected in series between said weighing cell output terminal and said converter means input terminal, means (9) connected with a decoupling junction (AK) between said weighing cell outlet and said resistor for separating said interference signal from said weighing signal, inverter means (4) for shifting the phase of said interference signal by 180°, and means for reintroducing the phase-shifted interference signal at a recoupling junction (EK) between said resistor and said converter means;

the improvement wherein said reintroducing means comprises a galvanic coupling (R3).

2. Apparatus as defined in claim 1, wherein said interference signal separating means includes a capacitive impedance (C).

3. Apparatus as defined in claim 2, wherein said inverter means (4) includes output and input terminals; wherein said separating means includes a filter circuit (9) having a second resistor (R1) and a capacitor (C) connected in series between said decoupling junction (AK) and said inverter means input terminal; and further wherein said galvanic coupling includes a third resistor (R3) connected between said inverter means output terminal and said recoupling junction (EK).

4. Apparatus as defined in claim 3, wherein said inverter means includes an operational amplifier (5) having a non-inverting input connected with ground.

5. Apparatus as defined in claim 3, wherein said inverter means includes an operational amplifier (4) having an inverting input connected with said filter circuit, and also including a feedback resistor (R2) connected between said inverter operational amplifier output and inverting input terminals.

6. Apparatus as defined in claim 1, wherein said analog-to-digital converter means and said inverter means include operational amplifiers (5,6), respectively, having parallel mutually-counteracting offset drifts.

7. Apparatus as defined in claim 6, wherein said inverter operational amplifier (5) includes a non-inverting input, and further including means (7) connecting said non-inverting input with said recoupling junction.

* * * * *